US006385045B1

(12) United States Patent
Tissington

(10) Patent No.: US 6,385,045 B1
(45) Date of Patent: May 7, 2002

(54) PUSH-BUTTON WATER-RESISTANT SWITCHING DEVICE

(75) Inventor: Brian Tissington, Birmingham (GB)

(73) Assignee: Valeo Electronique, Creteil (FR)

( * ) Notice: Subject to any disclaimer, the term of this patent is extended or adjusted under 35 U.S.C. 154(b) by 0 days.

(21) Appl. No.: 09/513,700

(22) Filed: Feb. 25, 2000

(30) Foreign Application Priority Data

Feb. 25, 1999 (GB) ........................................... 9905725

(51) Int. Cl.[7] ................................................ H05K 5/06

(52) U.S. Cl. ...................... 361/704; 361/627; 361/628; 361/631; 200/23; 200/302.2; 200/302.3; 307/117; 307/125; 307/126

(58) Field of Search ................................ 361/704, 705, 361/627, 628, 631, 647; 200/23, 511, 302.2, 52 R, 295; 307/117, 125, 126, 132 R; 73/497, 431, 514.32

(56) References Cited

U.S. PATENT DOCUMENTS 3,944,761 A * 3/1976 Nicholl et al. .......... 200/11 EA
3,973,099 A * 8/1976 Morris, Sr. ................. 200/511
4,575,004 A * 3/1986 Geiger ......................... 239/69
4,905,129 A * 2/1990 Sharrah ...................... 362/158
4,918,270 A * 4/1990 Orrico ..................... 200/302.2
4,940,860 A * 7/1990 Shiau .......................... 200/60
5,212,358 A * 5/1993 Yoshimura et al. ...... 200/61.45
5,282,116 A * 1/1994 Shiau ......................... 362/205

FOREIGN PATENT DOCUMENTS

WO 93/09553 5/1993

* cited by examiner

*Primary Examiner*—Lynn D. Feild
*Assistant Examiner*—David Foster
(74) *Attorney, Agent, or Firm*—Morgan & Finnegan, LLP

(57) ABSTRACT

A water-resistant switching device has an elastomeric body overmoulded to one part of the casing. The elastomeric body has a rib which co-operates with a hooked flange portion to define a space for receiving a hooked flange of another part of the casing to provide a watertight seal.

20 Claims, 3 Drawing Sheets

PUSH-BUTTON WATER-RESISTANT SWITCHING DEVICE

BACKGROUND OF THE INVENTION

The present invention relates to a water-resistant switching device and more particularly but not exclusively to an entry transmitter for a vehicle including such a switching device.

It is increasingly a requirement to provide electrical switching capable of being operated under damp conditions, for example in the open air when it is raining. In the case of entry transmitters for vehicles, which commonly use radio frequency or infra-red transmitters to operate entry systems for the corresponding vehicle, manufacturers are seeking increasing levels of waterproofing with current requirements ranging from 0.3 to 6 metres.

Prior art techniques to provide waterproofing in water-resistant switching devices include the use of an "O" ring seal, with pressure on the seal being maintained by, for example screws an overall elastomer keypad with the edge of the keypad crushed between two plastic elements and maintained there by clips, or by overmoulding the seal with elastomer.

These techniques have a number of defects, including the relatively high cost and difficulty of assembling when using screws and metal inserts, and the likelihood of plastic clips failing over long durations and high temperatures.

BRIEF SUMMARY OF THE INVENTION

It is an object of the present invention to at least partially mitigate the difficulties of the prior art.

According to a first aspect of the present invention there is provided a water-resistant switching device having a casing, the casing having first and second parts, said first part having a base wall and a peripheral edge wall, said device further comprising an elastomeric body extending along said base wall and forming an upstanding rib portion, wherein said rib portion is spaced from and co-operates with a portion disposed on the inside of side peripheral edge wall to receive a counterpart flange portion of the second part of said casing.

Preferably said counterpart flange portion has a thickness greater than said spacing, whereby when said counterpart flange portion of said second casing part is engaged with said portion, said rib portion resiliently grips said counterpart flange portion.

Conveniently said portion is part of said elastomeric body and forms an inwardly-directed flange portion from said peripheral edge wall, and said counterpart flange portion has an outwardly-directed lip for co-operation with said inwardly-directed flange portion.

Conveniently said portion is part of the peripheral edge wall and forms an inwardly-directed flange portion from said peripheral edge wall, and said counterpart flange portion has an outwardly-directed lip for co-operation with said inwardly-directed flange portion.

Conveniently said elastomeric body is secured to said first part of said casing.

Advantageously said elastomeric body is secured by overmoulding.

Conveniently said casing contains a circuit device, and said first part of said casing is an operating member for said circuit device.

Advantageously said casing contains a battery, and said first part of said casing is removable for changing said battery.

According to a second aspect of the present invention there is provided an entry transmitter for a vehicle comprising a water-resistant switching device according to the first aspect of the present invention.

BRIEF DESCRIPTION OF THE DRAWINGS

An embodiment of the present invention will now be described with reference to the accompanying drawings, in which.

In the various figures like reference numerals indicate like parts.

DETAILED DESCRIPTION OF THE INVENTION

Figure 1:
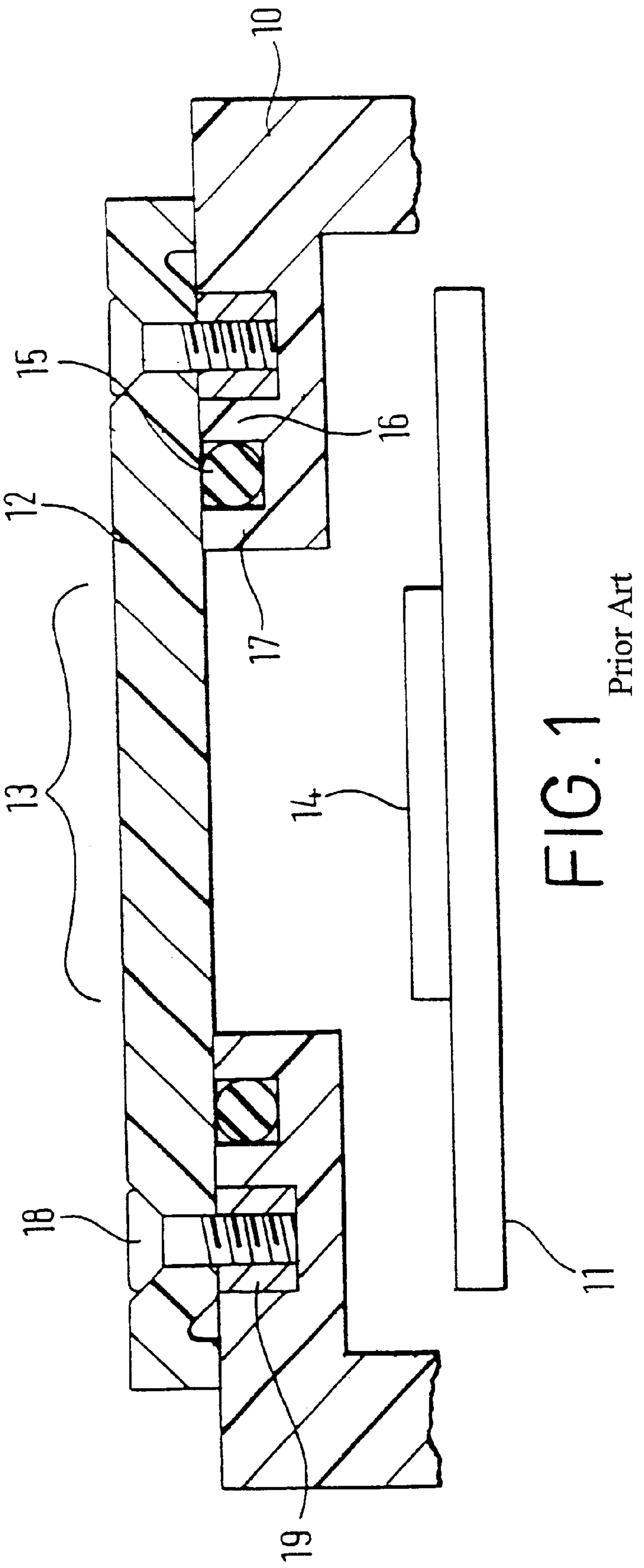
FIG. 1 Prior Art
FIG. 1 shows a first vehicle entry transmitter of the prior art.

Referring first to FIG. 1 which shows a cross section through a portion of a first vehicle entry transmitter, a body portion 10 extends to define a cavity within which there is disposed a circuit element 11.

A part 12 of rigid plastics is disposed to cover an opening 13 in the body 10 for access to replace battery 14. An O ring 15 is disposed between two concentric upstanding portions 16, 17 around the periphery of the opening 13 to afford waterproofing of the device. Screws 18 maintain an inward bias against the O ring so that waterproofing is maintained, and these are secured into threaded metal inserts 19.

Although this arrangement can provide a good waterproofing performance, it is expensive to implement, because of the cost of the screws and metal inserts to secure the screws and secondly because of the labour costs involved in assembly.

Figure 2:
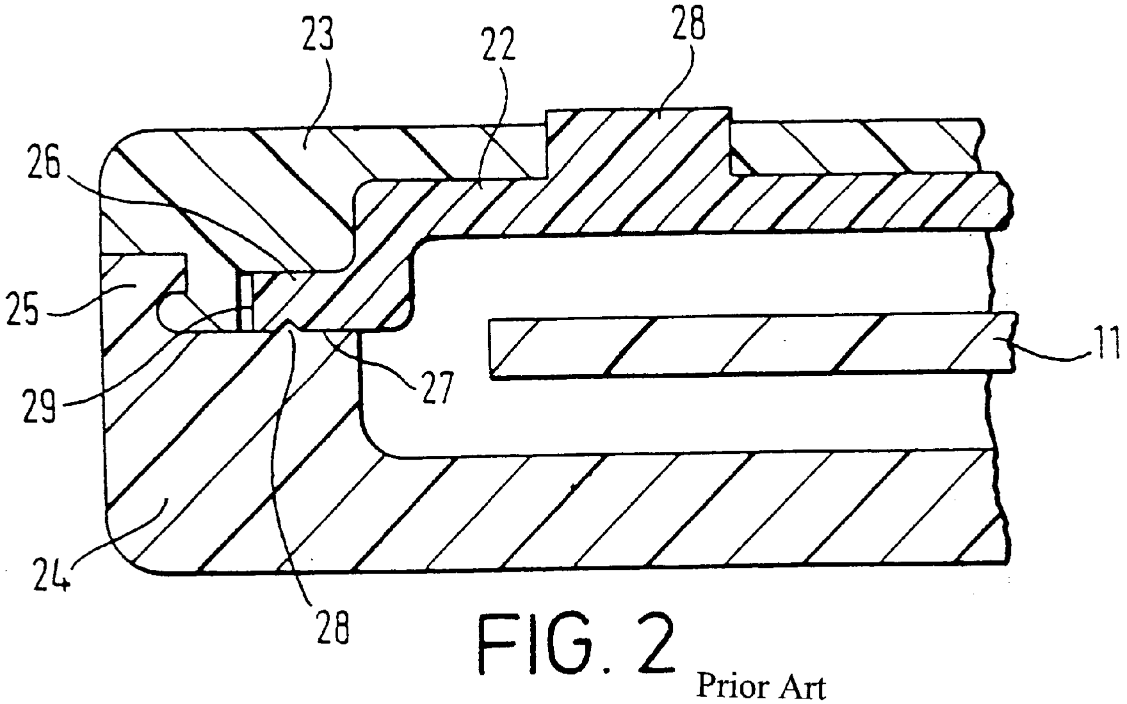
FIG. 2 Prior Art
FIG. 2 shows a second vehicle entry transmitter of the prior art.

Referring now to FIG. 2 an elastomeric operating member 22, has a button 28 projecting through a hole in the cap 23. A lower portion 24 of the entry device body defines, in co-operation with the operating member 22, a cavity within which the circuit member 11 is disposed. The lower portion 24 has an upstanding peripheral lip 25. The cap 23 is retained in position against the lip 25 by the clipping action of a shaped flange portion 29 against the lip 25. The elastomeric operating member 22 extends into a gap formed between a lower wall portion 26 of the cap and an upper wall portion 27 of the lower portion 24. To aid retention of the elastomeric portion, either of the walls 26 or 27 can be provided with a barb portion 28.

Figure 3:
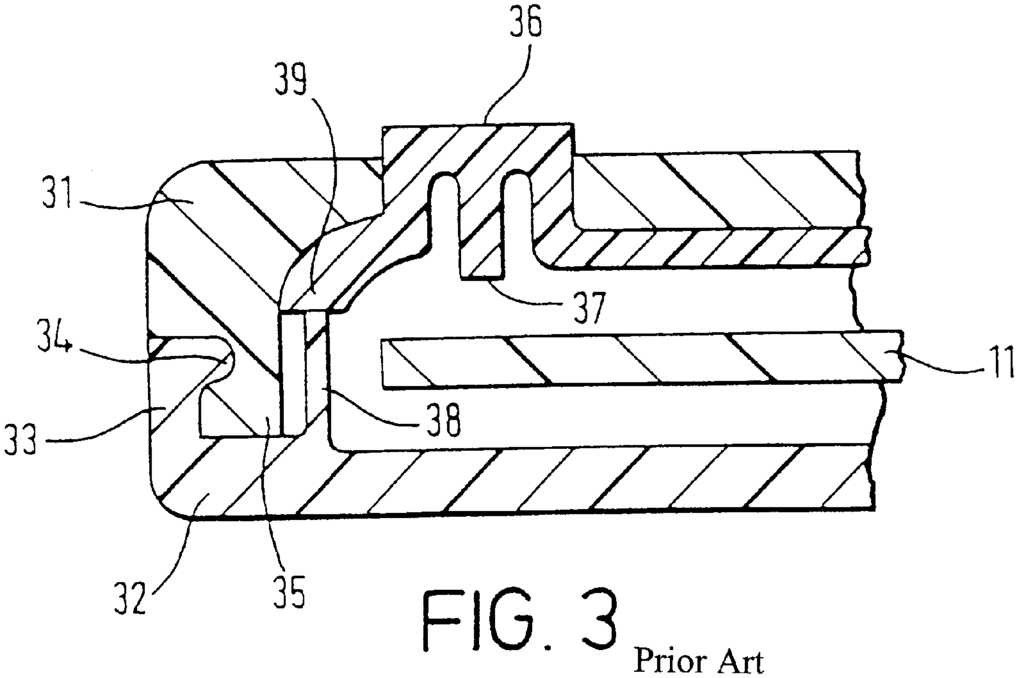
FIG. 3 Prior Art
FIG. 3 shows a third vehicle entry transmitter of the prior art.

Referring now to FIG. 3, a third vehicle entry transmitter has a body formed of two parts 31, 32 of which the lower 32 has an upstanding peripheral flange 33 with an inwardly-projecting lip portion 34 for clippingly engaging with a corresponding portion 35 of the upper part 31 to form a case. An elastomeric operating member 36 in the form of an elastomeric button protrudes through a hole of the upper part 31 and has a downward protrusion 37 for operating the circuit device 11. The button 36 extends along the inner wall of the upper part 31 and is overmoulded to that wall to form a seal therewith. The lower part 32 of the case has a further upstanding rib 38 which, when the two parts are clipped together, is urged against an end face 39 of the elastomer to retain it in place.

Figure 4:
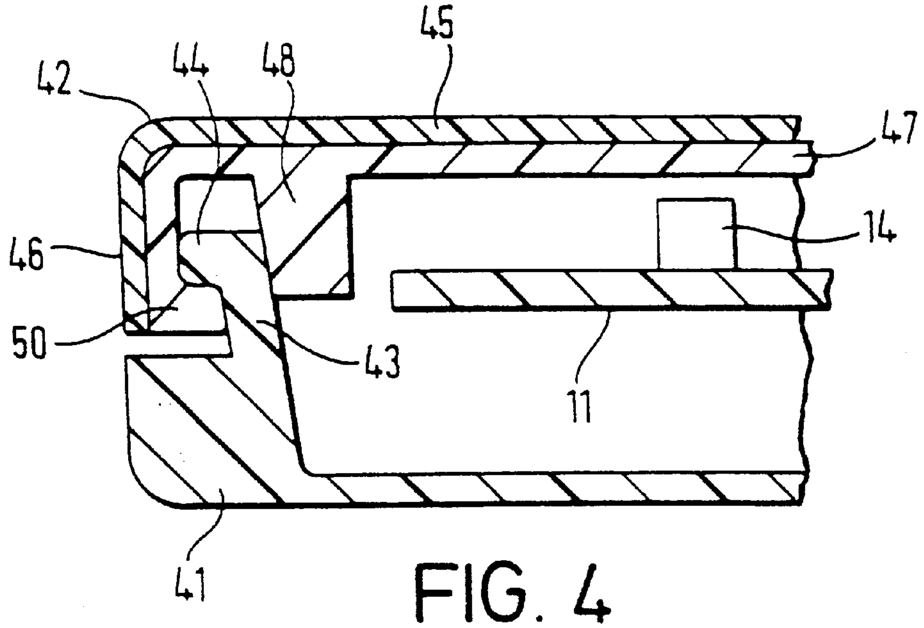
FIG. 4 shows a partial cross-section through a vehicle entry transmitter in accordance with a first embodiment of the present invention.

Referring now to FIG. 4, the casing of a vehicle entry transmitter according to an embodiment of the invention comprises a lower part 41 and an upper part 42. Both of these parts are made of hard plastics. The lower part 41, has an upstanding flange portion 43 spaced from the peripheral edge of the part with an outwardly-directed lip portion 44 at the distal end thereof.

The upper part 42, or first casing part, is a generally cup-shaped body having a generally planar base portion 45 and a peripheral side wall 46. An elastomeric body 47 extends along the inner wall of the upper part 42 and has an upstanding rib portion 48 extending from the base wall 45. A portion 50 disposed on the inside of the peripheral edge wall 46 is spaced from and co-operates with the rib portion 48 to receive the upstanding flange portion 43 of the lower part 41, or second part of the casing. In this embodiment, the portion 50 is part of the elastomeric body 47 and is made of the same material. This elastomeric body 47 can also be used to form buttons through a hole in the upper part 42 (not shown in the figures).

The portion 50 of the elastomeric body extends in an end region thereof to an inwardly-directed flange 51 so that the outwardly-directed lip portion 44 can be clipped into engagement with the upper part 42 and retained there by engagement between the lip portion 44 and the flange portion 51.

Figure 5:
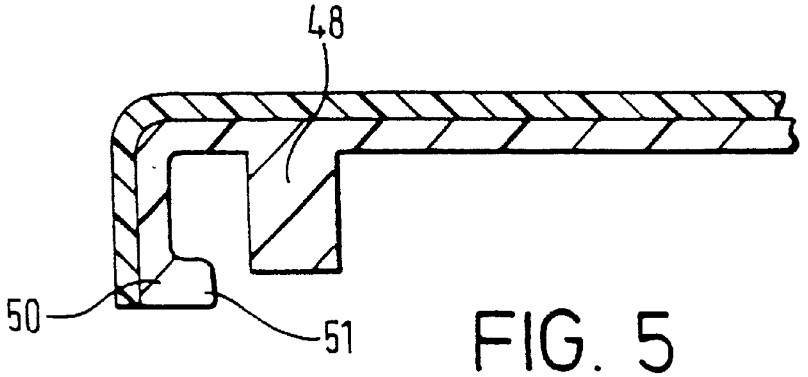
FIG. 5 shows a partial cross-section through the cap of the transmitter in FIG. 4.

By comparison of FIG. 4 and FIG. 5, it will be seen that the spacing between the rib portion 48 and the portion 50 is less than the width of the flange portion 43 with its lip portion 44, so that when the flange portion 43 of the lower part 41 is engaged with the portion 50 of the elastomeric body, the rib portion 48 resiliently grips the flange portion 43.

Figure 6:
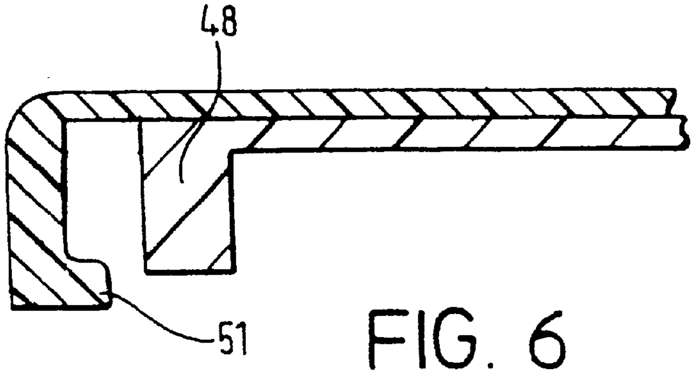
FIG. 6 shows a partial cross-section of another embodiment of the invention.

Referring now to FIG. 6, it is shown another embodiment of the invention where the portion 50 is part of the peripheral edge wall 46 of the upper part 42 and is in the same material hard plastic. The elastomeric body 47 extends along the base wall 45 and presents an upstanding rib portion 48. The other characteristics of this embodiment are the same as those describe in the context of FIG. 4 : the portion 50 forms an inwardly-directed flange portion 51 from said peripheral edge wall 46, and said counterpart flange portion 43 has an outwardly-directed lip 44 for co-operation with said inwardly-directed flange portion 51.

The elastomeric body 47 is overmoulded onto the hard plastics upper part 42 for a secure holding.

The hard plastics material of the upper part 42 is nonetheless sufficiently flexible that pressure in the unsupported region of the base 45 causes it to distort inwardly to engage the circuit for operation thereof.

It is possible to unclip the upper part 42 to provide access to the battery 14, for example to change the battery.

In an alternative embodiment the upper part 42 does not form an operating member, but is merely a casing part, removable for battery access.

The device of the invention is advantageous in that a simple clip-together assembly is afforded.

Although the invention has been described in the context of a vehicle entry transmitter, it is clear that other low voltage switching devices could use the same concept. Such devices include, for example, pagers and mobile phones and also external switching devices such as interphones and security locks.

What is claimed is:

1. A water-resistant switching device having a casing, said casing having first and second parts, said first part having a base wall and a peripheral edge wall, said second part having a counterpart flange portion; and an elastomeric body extending along said base wall and forming an upstanding rib portion, wherein said peripheral edge wall, said base wall, and said rib portion cooperatively define a receiving portion, wherein said rib portion is spaced from and co-operates with said receiving portion disposed on the inside of said peripheral edge wall to receive said counterpart flange portion of said second part of said casing.

2. A water-resistant switching device according to claim 1 wherein said receiving portion is further defined by a projection of said elastomeric body.

3. A water-resistant switching device according to claim 1 wherein said receiving portion is further defined by a projection of said peripheral edge wall.

4. A water-resistant switching device according to claim 1 wherein said counterpart flange portion has a thickness greater than the spacing between said rib portion and the inside of said peripheral edge wall, whereby when said counterpart flange portion of said second part is engaged with said receiving portion, said rib portion resiliently grips said counterpart flange portion.

5. A water-resistant switching device according to claim 1 wherein said receiving portion is further defined by an inwardly-directed flange portion extending from said peripheral edge wall, and said counterpart flange portion has an outwardly-directed lip for co-operation with said inwardly-directed flange portion.

6. A water-resistant switching device according to claim 1 wherein said elastomeric body is secured to said first part of said casing.

7. A water-resistant switching device according to claim 6 wherein said elastomeric body is secured by overmoulding.

8. A water-resistant switching device according to claim 1 further including a circuit device, wherein said casing contains said circuit device, and wherein said first part of said casing is an operating member for said circuit device.

9. A water-resistant switching device according to claim 1 further including a battery, wherein said casing contains said battery, and wherein said first part of said casing is removable for changing said battery.

10. An entry transmitter for a vehicle comprising a water-resistant switching device according to claim 1.

11. A water-resistant switching device comprising:

a casing having

- a first part including
  - a base wall,
  - an elastomeric body extending along the base wall and having a rib inwardly directed from the base wall,
  - a peripheral edge wall extending from the base wall, and
  - a first flange inwardly directed from the peripheral edge wall, the first flange and the rib defining a receiving portion; and
- a second part including
  - a second flange, the second flange shaped to be positioned in and co-operate with the receiving portion.

12. The water-resistant switching device of claim 11 wherein the elastomeric body further extends along the peripheral edge wall, and the first flange is an extension of the elastomeric body.

13. The water-resistant switching device of claim 11 wherein the first flange is an extension of the peripheral edge wall.

14. The water-resistant switching device of claim 11 wherein the width of the receiving portion is defined by spacing between the rib and the peripheral edge wall, the second flange having a thickness greater than a portion of the spacing, the second flange engaged in the receiving portion, the rib resiliently gripping the second flange.

15. The water-resistant switching device of claim 11 wherein the second flange has a lip outwardly-directed to the peripheral edge wall, the lip operative to cooperatively engage the first flange.

16. The water-resistant switching device of claim 11 wherein the elastomeric body is secured to the base wall of the first part of the casing.

17. The water-resistant switching device of claim 11 wherein the elastomeric body is overmoulded by the base wall of the first part of the casing.

18. The water-resistant switching device of claim 11 further including:

a circuit device disposed within the casing, wherein the first part of the casing is an operating member for the circuit device.

19. The water-resistant switching device of claim 11 further including:

a battery disposed within the casing, wherein the first part of the casing is removable.

20. An entry transmitter for a vehicle including the water-resistant switching device according to claim 11.

* * * * *